(12) United States Patent
Williams (10) Patent No.: US 6,691,295 B2
(45) Date of Patent: Feb. 10, 2004

(54) MANAGING ONE OR MORE DOMAINS IN A SYSTEM OVER A NETWORK CONNECTION

(75) Inventor: Ricki D. Williams, Temecula, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 87 days.

(21) Appl. No.: 09/962,435

(22) Filed: Sep. 25, 2001

(65) Prior Publication Data

US 2003/0061588 A1 Mar. 27, 2003

(51) Int. Cl.[7] .................................. G06F 17/50
(52) U.S. Cl. .................... 716/12; 716/14; 716/13
(58) Field of Search ................ 716/8, 9, 10, 11, 716/12, 1, 16, 13, 14, 15; 714/6, 9, 20, 31, 47; 703/20, 11

(56) References Cited

U.S. PATENT DOCUMENTS

| | | | | | |
|---|---|---|---|---|---|
| 5,367,670 A | * | 11/1994 | Ward et al. | ................ | 714/47 |
| 5,402,431 A | * | 3/1995 | Saadeh et al. | ................ | 714/47 |
| 6,138,250 A | * | 10/2000 | Nouri et al. | ................ | 714/31 |
| 6,208,955 B1 | * | 3/2001 | Provan et al. | ................ | 703/20 |
| 6,263,452 B1 | * | 7/2001 | Jewett et al. | ................ | 714/9 |
| 6,477,060 B1 | | 11/2002 | Peter et al. | | |
| 2002/0002690 A1 | * | 1/2002 | Lai et al. | ................ | 714/6 |

* cited by examiner

Primary Examiner—Matthew Smith
Assistant Examiner—Binh C. Tat
(74) Attorney, Agent, or Firm—Meyertons Hood Kivlin Kowert & Goetzel, P.C.; B. Noël Kivlin (57) ABSTRACT

The present invention provides management of one or more domains in a processor-based system over a network connection. An apparatus is provided that comprises a first plane adapted to receive a first voltage level and a second plane adapted to receive a second voltage level. The apparatus further comprises a path asymmetrically positioned between the first plane and the second plane, wherein the path is capable of providing the network connection to one or more devices within the processor-based system.

24 Claims, 10 Drawing Sheets

MANAGING ONE OR MORE DOMAINS IN A SYSTEM OVER A NETWORK CONNECTION

BACKGROUND OF THE INVENTION

1. Field of the Invention

This invention relates generally to a processor-based system, and, more particularly, to managing one or more domains within a processor-based system over a network connection.

2. Description of the Related Art

The last several years have witnessed an increased demand for network computing, partly due to the emergence of the Internet. Some of the notable trends in the industry include a boom in the growth of Applications Service Providers (ASPs) that provide applications to businesses over networks and enterprises that use the Internet to distribute product data to customers, take orders, and enhance communications with employees.

Businesses typically rely on network computing to maintain a competitive advantage over other businesses. As such, developers, when designing processor-based systems for use in network-centric environments, may take several factors into consideration to meet the expectation of the customers, factors such as functionality, reliability, scalability, and performance of such systems.

One example of a processor-based system used in a network-centric environment is a mid-range server system. A single mid-range server system may, for example, be configured for a plurality of domains, where a domain, for example, may act as a separate machine by running its own instance of an operating system to perform one or more of the configured tasks.

The benefits of providing substantially independently operating domains within an integrated system become readily apparent as customers are able to perform a variety of tasks that would otherwise be reserved for several different machines. However, managing a plurality of domains within a system sometimes proves to be a challenging task, as designers of such systems have a finite number of resources to build a functioning system that also meets customer demands. For example, managing one or more domains in a system may consume valuable hardware resources that could otherwise be used to deliver additional features to the customers.

There is thus a need for an efficient way of managing one or more domains in a system over a network connection.

SUMMARY OF THE INVENTION

In one aspect of the instant invention, an apparatus is provided for managing one or more domains in a processor-based system over a network connection. The apparatus comprises a first plane adapted to receive a first voltage level and a second plane adapted to receive a second voltage level. The apparatus further comprises a path asymmetrically positioned between the first plane and the second plane, wherein the path is capable of providing the network connection to one or more devices within a processor-based system.

In another aspect of the present invention, a method is provided for managing one or more domains in a processor-based system over a network connection. The method comprises receiving a signal from a control unit and delivering the signal to one or more domains in a processor-based system over an Ethernet network path that is asymmetrically positioned between a power plane and a ground plane.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
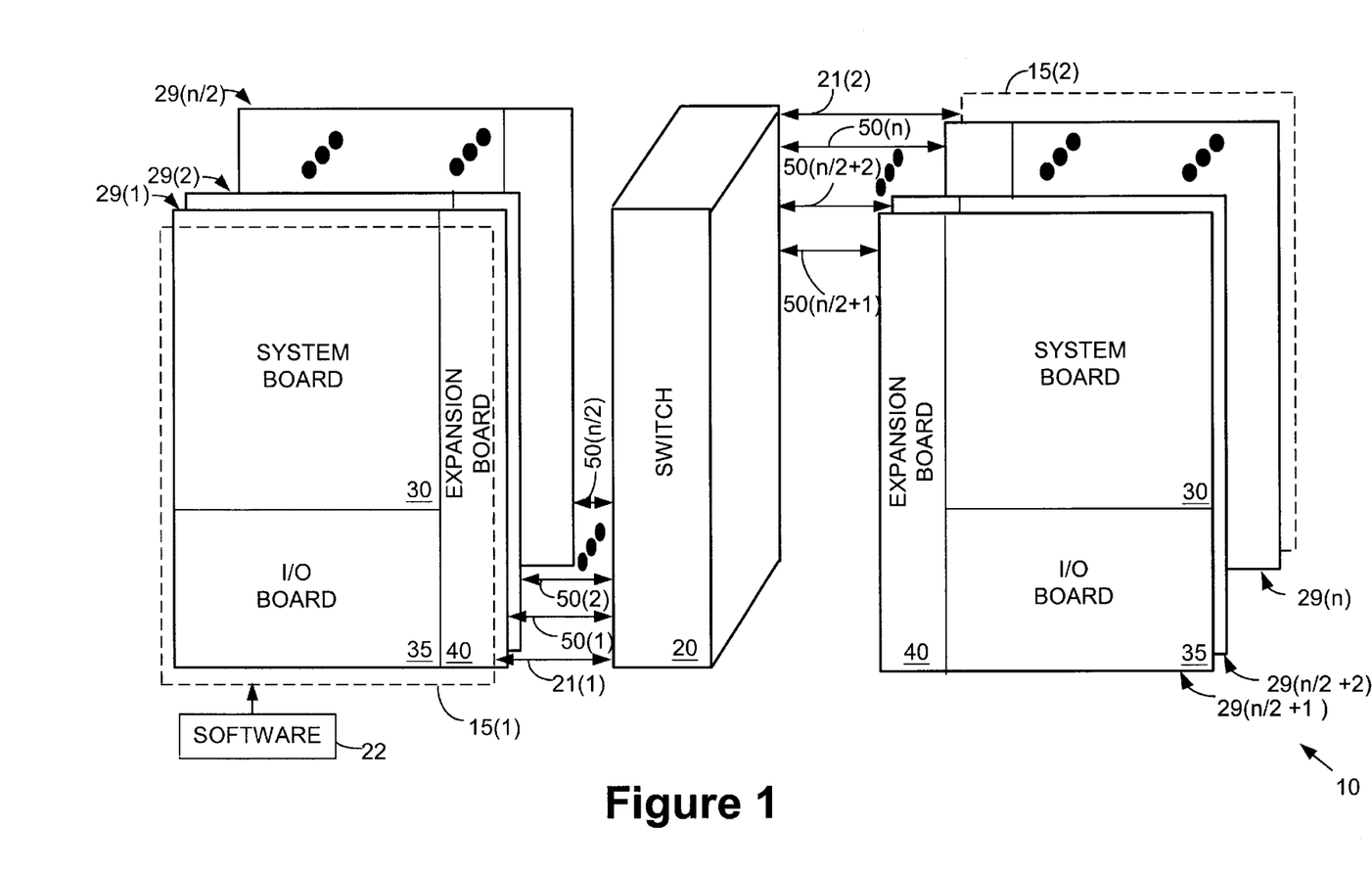
FIG. 1 shows a stylized block diagram of a system in accordance with one embodiment of the present invention.

Referring now to FIG. 1, a block diagram of a system 10 in accordance with one embodiment of the present invention is illustrated. The system 10, in one embodiment, includes a plurality of system control boards 15(1-2) that are coupled to a switch 20. For illustrative purposes, lines 21(1-2) are utilized to show that the system control boards 15(1-2) are coupled to the switch 20, although it should be appreciated that, in other embodiments, the boards 15(1-2) may be coupled to the switch in any of a variety of ways, including by edge connectors, cables, or other available interfaces.

In the illustrated embodiment, the system 10 includes two control boards 15(1-2), one for managing the overall operation of the system 10 and the other to provide redundancy and automatic fallover in the event that the other board fails. Although not so limited, in the illustrated embodiment, the first system control board 15(1) serves as a "main" system control board, while the second system control board 15(2) serves as an alternate hot-swap replaceable system control board.

The main system control board 15(1) is generally responsible for providing system controller resources for the system 10. If failures of the hardware or software occur on the main system control board 15(1) or failures on any hardware control path from the main system control board 15(1) to other system devices occur, the system controller failover software 22 automatically triggers a failover to the alternative control board 15(2). The alternative system control board 15(2), in one embodiment, assumes the role of the main system control board 15(1) and takes over the main system controller responsibilities. To accomplish the transition from the main system control board 15(1) to the alternative system control board 15(2), it may be desirable to replicate the system controller data, configuration, and/or log files on both of the system control boards 15(1-2).

In one embodiment, during any given moment, generally one of the two system control boards 15(1-2) actively controls the overall operations of the system 10. Accordingly, the term "active system control board," as utilized hereinafter, may refer to either one of the system control boards 15(1-2), depending on the board that is managing the operations of the system 10 at that moment.

The system 10, in one embodiment, includes a plurality of system board sets 29(1-n) that are coupled to the switch 20, as indicated by lines 50(1-n). The system board sets 29(1-n) may be coupled to the switch 20 in one of several ways, including edge connectors or other available interfaces. The switch 20 may serve as a communications conduit for the plurality of system board sets 29(1-n), half of which may be connected on one side of the switch 20 and the other half on the opposite side of the switch 20.

The switch 20, in one embodiment, may be a 18×18 crossbar switch that allows system board sets 29(1-n) and system control boards 15(1-2) to communicate, if desired. Thus, the switch 20 may allow the two system control boards 15(1-2) to communicate with each other or with other system board sets 29(1-n), as well as allow the system board sets 29(1-n) to communicate with each other. As described in more detail below, in accordance with one embodiment of the present invention, the system control boards 15(1-2) use a standard communications protocol connection through the switch 20 to communicate with one or more of the system board sets 29(1-n).

The system board sets 29(1-n), in one embodiment, comprise one or more boards, including a system board 30, I/O board 35, and expansion board 40. The system board 30 may include processors, as well as memories, for executing, in one embodiment, applications, including portions of an operating system. The I/O board 35 may manage I/O cards, such as peripheral component interface cards and optical cards, that are installed in the system 10. The expander board 40, in one embodiment, generally acts as a multiplexer (e.g., 2:1 multiplexer) to allow both the system and I/O boards 30, 35 to interface with the switch 20, which, in some instances, may have only one slot for interfacing with both boards 30, 35.

In one embodiment, the system 10 may be dynamically subdivided into a plurality of system domains, where each domain may have a separate boot disk (to execute a specific instance of the operating system, for example), separate disk storage, network interfaces, and/or I/O interfaces. Each domain, for example, may operate as a separate machine that performs a variety of user-configured services. For example, one or more domains may be designated as an application server, a web server, database server, and the like. In one embodiment, each domain may run its own operating system (e.g., Solaris operating system) and may be reconfigured without interrupting the operation of other domains.

Figure 2:
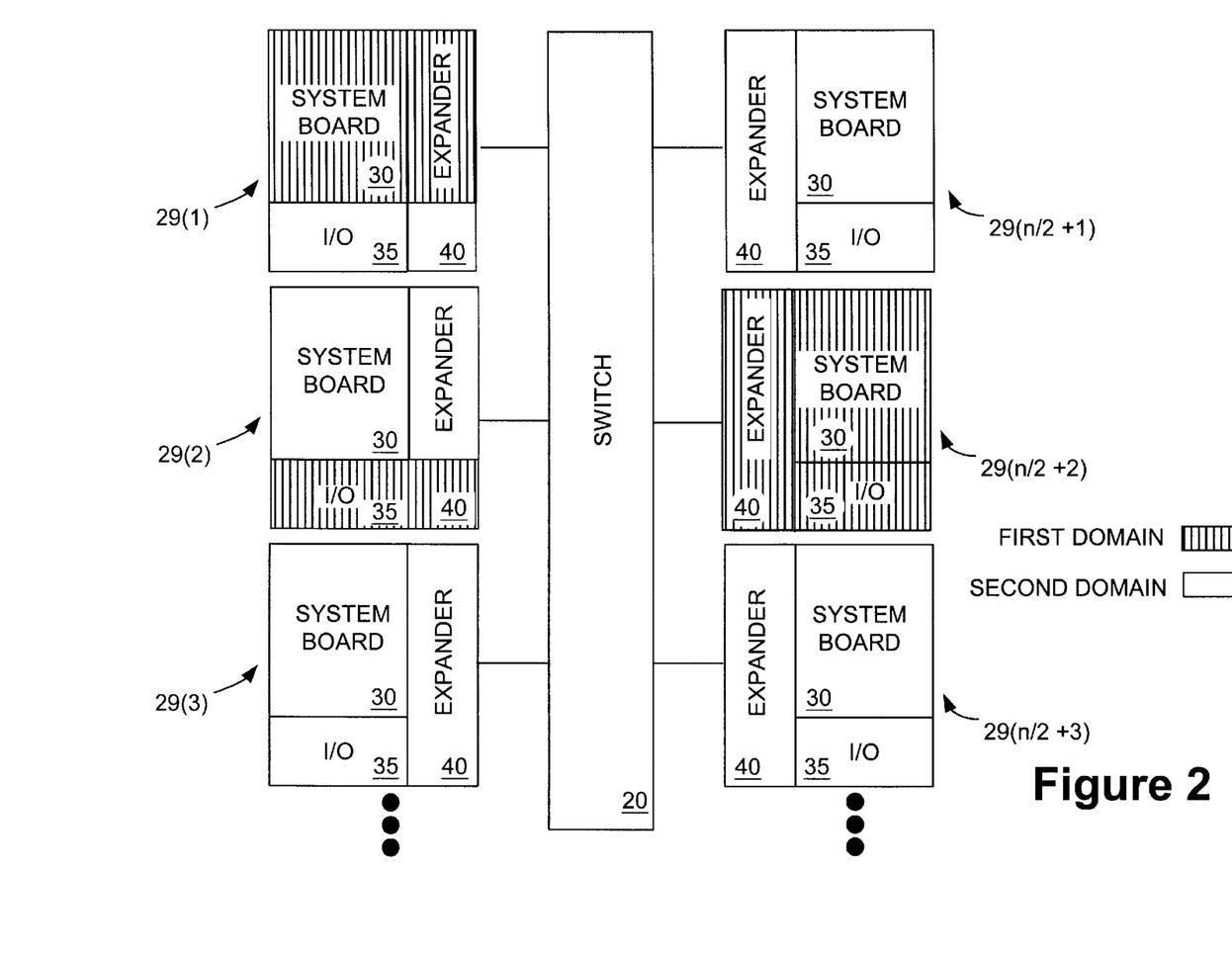
FIG. 2 illustrates a block diagram of an exemplary domain configuration that may be employed in the system of FIG. 1, in accordance with one embodiment of the present invention.

FIG. 2 illustrates an exemplary arrangement where at least two domains are defined in the system 10. The first domain, identified by vertical cross-sectional lines, includes the system board set 29(n/2+2), the system board 30 of the system board set 29(1), and the I/O board 35 of the system board set 29(2). The second domain in the illustrated embodiment includes the system board sets 29(3), 29(n/2+1), and 29(n/2+3), as well as the I/O board 35 of the system board set 29(1) and the system board 30 of the system board set 29(2).

As shown, a domain may be formed of an entire system board set 29(1-n), one or more boards (e.g., system board 30, I/O board 35) from selected system board sets 29(1-n), or a combination thereof. Although not necessary, it may be possible to define each system board set 29(1-n) as a separate domain. For example, if each system board set 29(1-n) were its own domain, the system 10 may conceivably have up to "n" (i.e., the number of system board sets) different domains. When two boards (e.g., system board 30, I/O board 35) from the same system board set 29(1-n) are in different domains, such a configuration is referred to as a "split expander." The expander board 40 of the system board sets 29(1-n), in one embodiment, keeps the transactions separate for each domain. No physical proximity may be needed for boards in a domain.

A domain is generally isolated from other domains. In one embodiment, the communications between two or more domains may not be directly possible except through an agent or some external arbitrator device, for example. Thus, in one embodiment, the communications within a domain are generally secure from other domains in the system 10.

Using the switch 20, inter-domain communications may be possible. For example, the switch 20 may provide a high-speed communications path so that data may be exchanged between the first domain and the second domain of FIG. 2. In one embodiment, a separate path for data and address through the switch 20 may be used for inter-domain communications.

Figure 3:
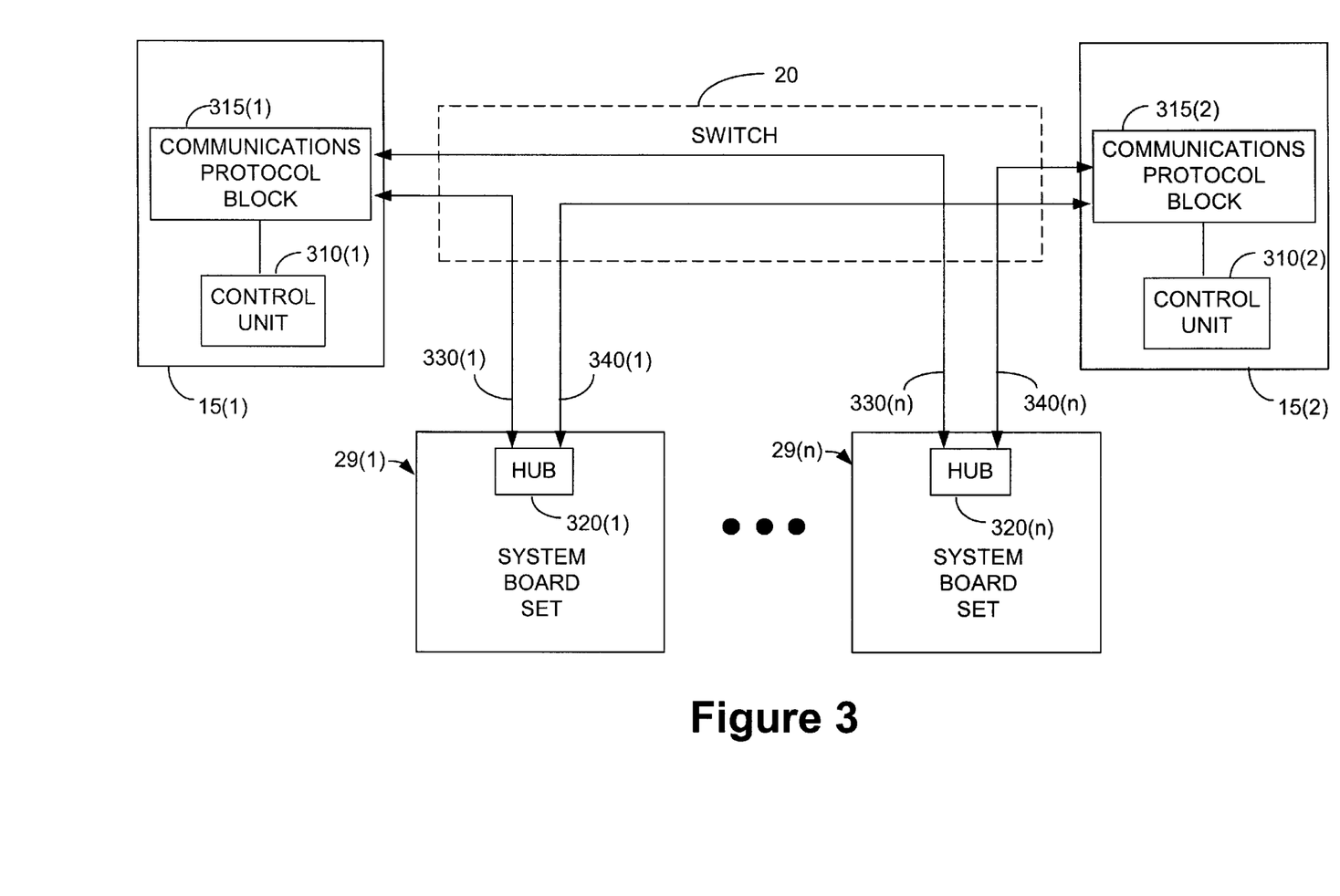
FIG. 3 depicts a block diagram of an exemplary arrangement that may be employed in the system of FIG. 1 for managing one or more of the domains shown in FIG. 2, in accordance with one embodiment of the present invention.

Referring now to FIG. 3, an exemplary arrangement for managing one or more of the domains defined in the system 10 is illustrated. In the illustrated embodiment, each of the system control boards 15(1-2) includes a respective control unit 310(1-2) and communications protocol block 315(1-2). As explained earlier, the second control board 15(2) may serve as a back-up for the first control board 15(1) by assuming control should the first control board 15(1) fail. The exemplary arrangement of FIG. 3, as described below, allows the second control board 15(2) to communicate with one or more domains (comprising the entire system board set 29(1-n) or selected portions thereof) in case of a malfunction in the first control board 15(1).

The control units 310(1-2), in one embodiment, may be microprocessors that are coupled to the respective communications protocol blocks 315(1-2). The communications protocol blocks 315(1-2) may be a protocol layer for any one of a variety of industry-accepted standards, such as the I.E.E.E. 802.3 Ethernet standard, the I.E.E.E. 802.5 Token Ring standard, Transmission Control Protocol standard, asynchronous transfer mode (ATM) standard, and the like. In an alternative embodiment, the communications protocol blocks 315(1-2) may be a protocol layer for a private, or any other available, communications protocol. In one embodiment, the communications protocol blocks 315(1-2) may also include the device driver layer for the communications protocol that is employed.

In one embodiment, each system board set 29(1-n) includes a hub 320(1-n) that is coupled to respective communications protocol blocks 315(1-2) of the control boards 15(1-2). Each system control board set 29(1-n), in one embodiment, includes the hub 320(1-n) to allow communications with either one of the two control boards 15(1-2). It should be appreciated that in implementations where a back-up control board may not be desired, the use of the hubs 320(1-n) may be optional, as a hub may not be required to facilitate the transition from one system control board to another in case of a failure. Additionally, it should be noted that the hubs 320(1-n) may be situated in any desirable location on the system board set 29(1-n), including on the system board 30, I/O board 35, or the expansion board 40 of the system board set 29(1-n).

In one embodiment, the system control board 15(1) may communicate with one or more of the system board sets 29(1-n) using connections 330(1-n). Similarly, in one embodiment, the alternative system control board 15(2) may communicate with one or more of the system board sets 29(1-n) using connections 340(1-n). In one embodiment, the connections 330(1-n) or 340(1-n) individually, or collectively, form a network, such as an Ethernet network, over which the active system control board 15(1-2) may manage or control one or more domains formed of one or more boards of the system board sets 29(1-n). Each connection 330(1-n) or 340(1-n), in one embodiment, may be a bi-directional, differential pair link that runs between the system control board 15(1-2) and the system board sets 29(1-n) through the switch 20.

Figure 4A:
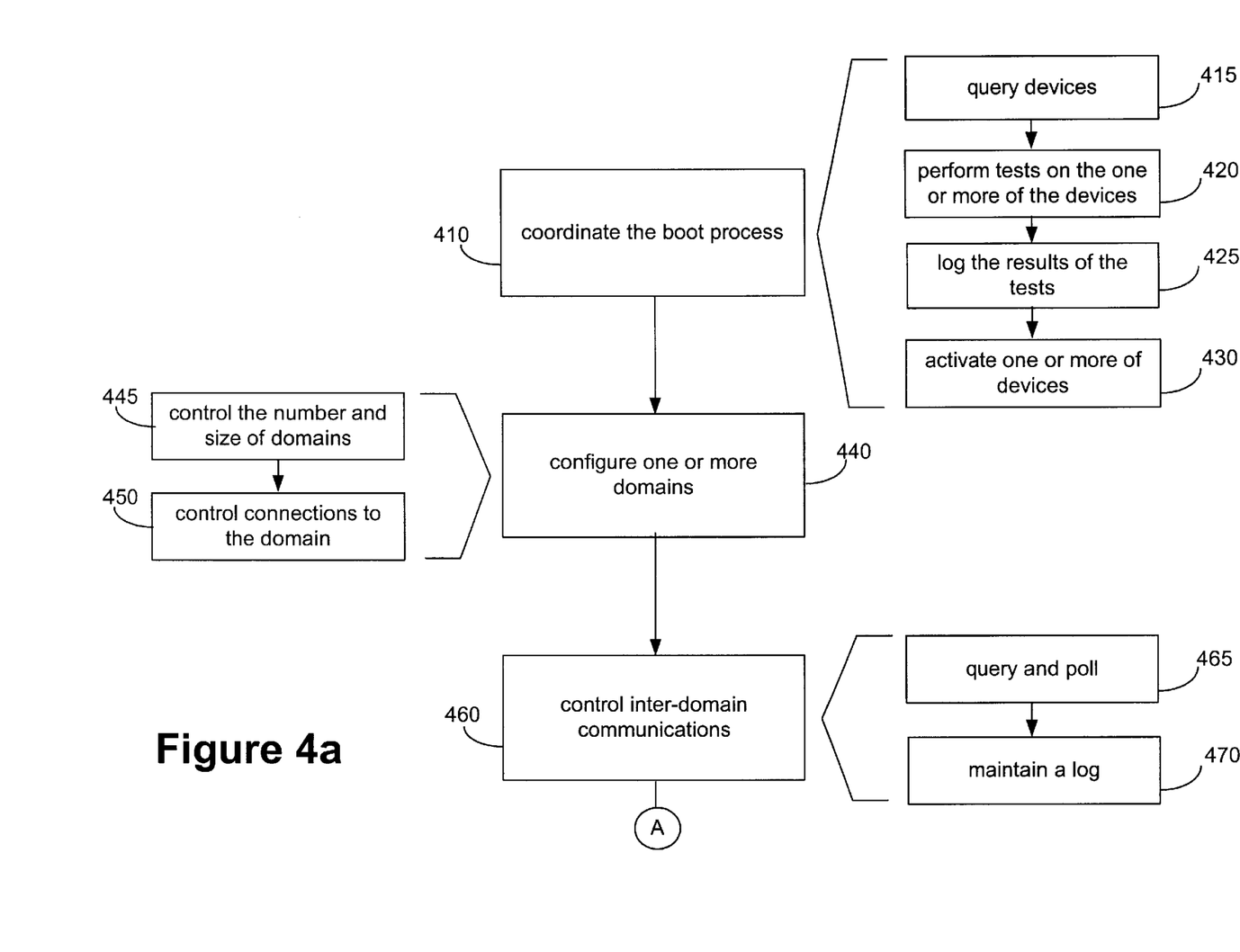
FIGS. 4*a*–*b* illustrate a flow diagram of a method that may be implemented in the system of FIG. 1, in accordance with one embodiment of the present invention.

Referring now to FIG. 4, one embodiment of a method that may be employed by the exemplary arrangement of FIG. 3 to manage one or more of the defined domains is illustrated. The active system control board 15(1-2), in one embodiment, coordinates (at 410) the boot process for the system 10 over the connections 330(1-n) or 340(1-n) (see FIG. 3). Coordinating the boot process may, in one embodiment, entail querying (at 415) devices (e.g., one or more components in the system board sets 29(1-n)), performing (at 420) tests on the queried devices, logging (425) the results of the tests performed (at 420), and activating (430) the one or more tested devices.

The active system control board 15(1-2), in one embodiment, configures (at 440) one or more domains in the system 10 over one or more of the connections 330(1-n) or 340(1-n). In one embodiment, configuring one or more domains may include controlling the number of domains that may be configured, as well as controlling the sizes of those domains. In one embodiment, for domains that contain more than one system board sets 29(1-n), the active system control board 15(1-2) may designate a particular system board set 29(1-n) as the central connection point for the other boards 29(1-n) in that domain.

The active system control board 15(1-2), in one embodiment, controls (at 460) interdomain communications, which may entail querying and polling (at 465) one or more of the domains to determine the operational status of the domains. In one embodiment, the active system control board 15(1-2) may maintain (at 470) a log of information, such as the amount of data traffic, that may be useful in debugging should one or more of the domains fail.

Figure 4B:
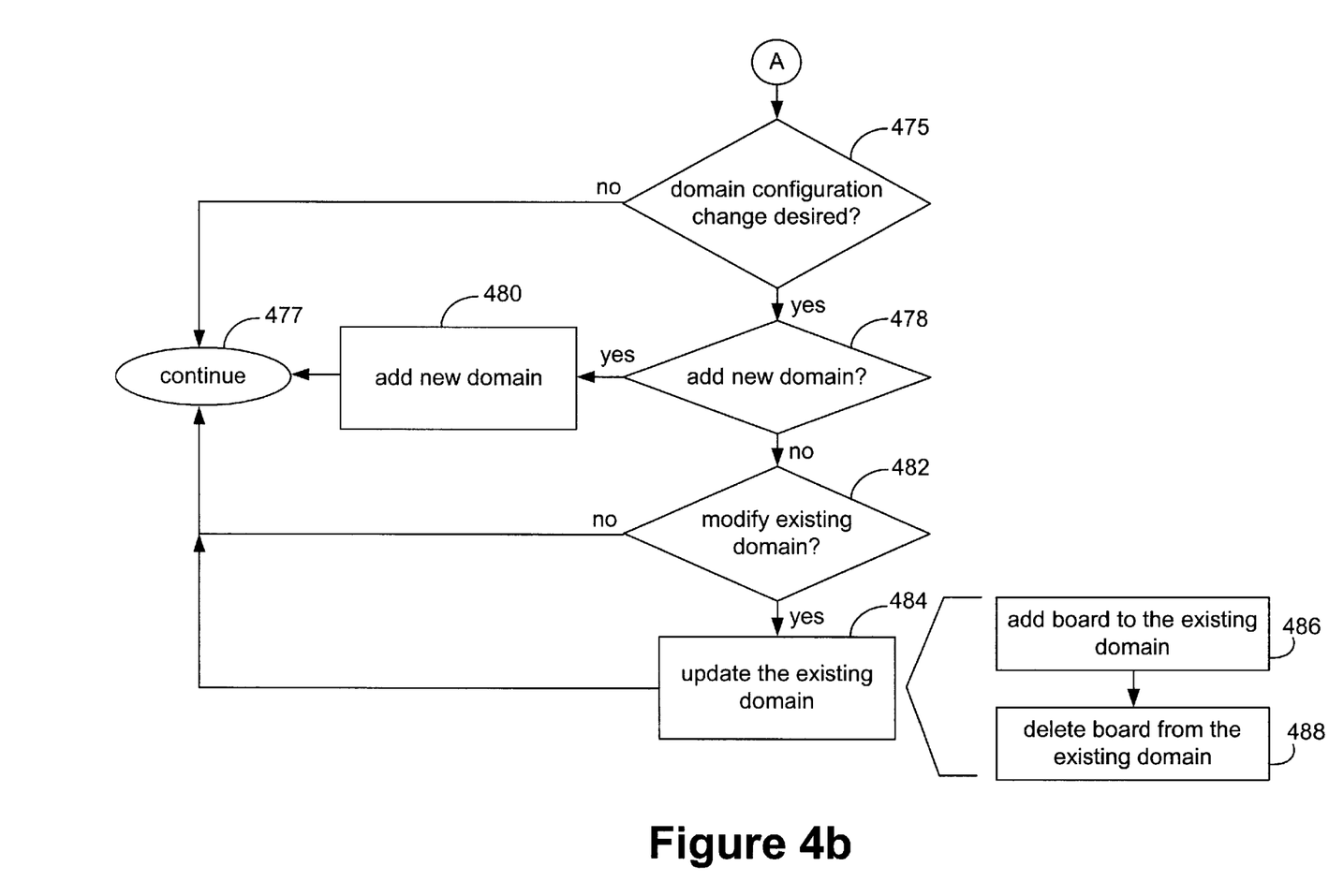

The active system control board 15(1-2), in one embodiment, determines (at 475) whether a change in the domain configuration is desired. A user may desire to change the domain configuration, for example, to add a new domain or modify one or more of the existing domains. A change in the domain configuration may be desired when the user for example, expressly requests to modify an existing domain configuration, or, alternatively, when the user simply adds or removes boards (e.g., system board 30, I/O board 35, expansion board 40) to and from the system 10. Since, in one embodiment, one or more boards may be hot-swapped from the system 10 while it is operating, the mere act of removing or adding a board may be an indication that a change in the domain configuration is desired by the user.

If no change in the domain configuration is desired (at 475), then the active system control board 15(1-2), in one embodiment, continues (at 477) with its normal operation. If, however, a change in the domain configuration is desired (at 475), then the active system control board 15(1-2), in one embodiment, determines (at 478) whether the user desires to add a new domain. If the user wishes (at 478) to add a new domain, then the active system control board 15(1-2), in one embodiment, allows (at 480) the user to add the desired domain in the system 10. The active system control board 15(1-2) then, in one embodiment, continues (at 477) with normal operations.

If it is determined (at 478) that the user does not wish to add a new domain, then the active system control board 15(1-2), in one embodiment, determines (at 482) whether the user desires to modify (at 482) the existing domain configuration. If no modification is desired (at 482) by the user, then the active system control board 15(1-2) continues (at 477) with normal operations. If the user desires to modify (at 482) the existing domain configuration, then the active system control board 15(1-2), in one embodiment, updates (at 484) the domain configuration accordingly. Updating (at 484) the existing domain configuration, in one embodiment, may include adding (at 486) or removing (at 488) boards (e.g., system board 30 and I/O board 35 see FIG. 1) to and from the existing domains.

Figure 5:
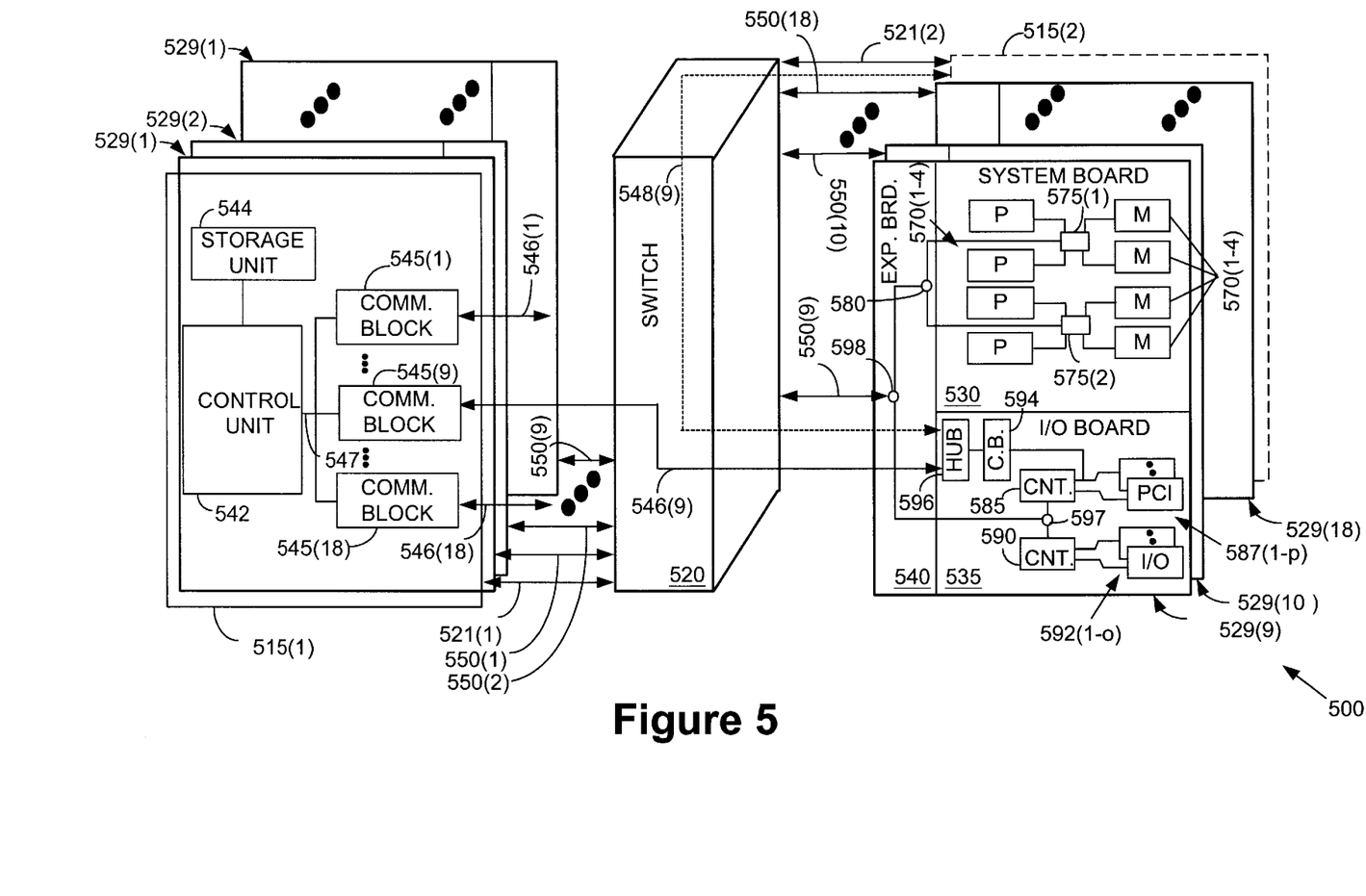
FIG. 5 illustrates a stylized block diagram of an alternative embodiment of a system, in accordance with the present invention.

Referring now to FIG. 5, a block diagram of an alternative embodiment of the system 10 of FIG. 1 is illustrated. In particular, FIG. 5 illustrates a system 500 that, in one embodiment, includes two system control boards 515(1-2) that are capable of interfacing with a plurality (eighteen in the illustrated embodiment) of system board sets 529(1-18) through a switch 520. In one embodiment, one system control board 515(1-2) may serve as a back-up for the other board.

Although not so limited, in the illustrated embodiment the system 500 has a symmetrical configuration, where one half of the system board sets 529(1-18) are on one side of the switch 520, and the other half of the system board sets 529(1-18) are on the opposite side of the switch 520. Additionally, in the illustrated embodiment, the first system control board 515(1) and the second system control board 515(2) are diagonally positioned from each other relative to the switch 520. The symmetrical positioning of the boards 515(1-2), 529(1-18) in the illustrated manner may take advantage of the interface connections on both sides of the switch 520.

The system board sets 529(1-18), in one embodiment, include one or more system boards 530, 535, and 540. Although not so limited, in the illustrated embodiment, each system board set 29(1-n) is formed of three boards, a system board 35 (also referred to as "slot 0" board), an input/output (I/O) board 40 (also referred to as "slot 1" board), and an expansion board 45. The components of the three types of boards 530, 535, and 540 are described in more detail below.

In one embodiment, the system 500 may be dynamically subdivided into a plurality of system domains, where the active system control board 515(1-2) manages the domains using an internal Ethernet network, as described in more detail below. Although not so limited, in the illustrated embodiment, the domains are managed by the active system control board 515(1-2) through the I/O board 535, as such, it may be desirable for each domain to include at least one I/O board 535. In one embodiment, physical proximity may not be needed for boards to belong in the same domain; accordingly, it may be possible for a system board 530 and I/O board 535 of a selected system board set 529(1-18) to belong to two separate domains. Exemplary domains may thus be formed of entire system board sets 29(1-n) or selected system boards from within one or more of the system board sets 29(1-n).

For ease of illustration and to avoid unnecessarily obscuring the invention, only selected relevant elements of the first system control board 515(1) are shown, although it should be appreciated that, in other embodiments, the first system control board 515(1) may include additional or fewer elements, depending on the implementation. In one embodiment, although not shown, the second system control board 515(2) may have a similar configuration as the first system control board 515(1).

The system control board 515(1) includes a control unit 542 coupled to a storage unit 544 and one or more communications blocks 545(1-18). Although not so limited, each system control board 515(1-2) in the illustrated embodiment includes one communications block 545(1-18) for interfacing with the I/O board 535 of each system board set 529(1-18) over respective connections 546(1-18). Thus, if each system board set 529(1-18) is configured to be its own domain, the active system control board 515(1-2), in one embodiment, may manage each domain through the I/O board 535 of each system board set 529(1-18). In one embodiment, where a domain contains more than one I/O board 535, the system control board 515(1) may designate one I/O board 535 as a central contact point through which communications with that domain occurs.

Each of the communications blocks 545(1-18), in one embodiment, may be an application specific integrated circuit (ASIC) that provides a peripheral control interface (PCI) and an Ethernet interface, such as the RIO® ASIC provided by Sun® Microsystems. As such, in one embodiment, the connection 547 between the control unit 542 and the communications blocks 545(1-18) may be a PCI connection, while the connections 528 (118) between the communications blocks 545(1-18) and the respective I/O board 535 of the domains may be an Ethernet connection.

The system board 530 of each system board set 529(1-18) in the illustrated embodiment includes four processors 560 (1-4), with each of the processors 560(1-4) having an associated memory 570(1-4). The processors 560(1-4), in one embodiment, may be able to access their own respective memory 570(1-4), as well as access the memory associated with other processors. In one embodiment, a different number of processors and memories may be employed in any desirable combination, depending on the implementation. In one embodiment, two five-port dual data switches 575(1-2) connect the processor/memory pairs (e.g., processors 560 (1-2)/memories 570(1-2) and processors 560(3-4)/memories 570(3-4)) to a board data switch 580.

Although not so limited, the I/O board 535 of each system board set 529(1-18) in the illustrated embodiment includes a controller 585 for managing one or more of the PCI cards that may be installed in one or more PCI slots 587(1-p). In the illustrated embodiment, the I/O board 535 also includes a second controller 590 for managing one or more of I/O cards that may be installed in one or more I/O slots 592(1-o). The I/O slots 592(1-o) may receive optics cards, network cards, and the like. The I/O board 535, in one embodiment, includes a communications block 594 coupled between an input terminal of a hub 596 and an input terminal of the controller 585.

The two controllers 585, 590, in one embodiment, are coupled to a data switch 597. A switch 598 in the expansion board 540 receives the output signal from the switch 597 of the I/O board 535 and from the switch 580 of the system board set 529(9) and provides it to the switch 520 of the system 500. While lines 550(1-18) illustrate that the system board sets 529(1-18) may be coupled to the switch 520, it should be appreciated that the coupling may be accomplished by one of several ways, including, but not limited to, using edge connectors, cables, or other available interfaces. In one embodiment, the system board sets 529(1-18) may include two separate sets of switches, where one set of switches may be for a data path and the other for an address path.

The switch 520, in one embodiment, may include three 18×18 crossbar switches that provide a separate data path, address path, and control signal path to allow inter-domain communications. Using separate paths for data, addresses, and control signals, in one embodiment, may reduce the interference among data traffic, address traffic, and control signal traffic. In one embodiment, the switch 520 may provide a bandwidth of about 43 Gigabytes per second. In other embodiments, a higher or lower bandwidth may be achieved using the switch 520.

As shown in FIG. 5, in one embodiment, a first terminal of the hub 595 of the I/O board 535 of the system board set 529(9) is coupled to the first communications block 545(1) of the first system control board 515(1) by the connection 546(9) and the second terminal of the hub 595 is connected to a communications block (not shown) of the second system control board 515(2) over the connection 548(9). In one embodiment, the hubs 595 of the I/O boards 535 of the remaining system board sets 529(1-8,10-18) are connected in a similar manner to the respective communication blocks 545(1-8,10-18) of the system control boards 515(1-2). Individual connections 546(1-18), or the connections 546(1-18) as a whole, in the illustrated embodiment may be viewed as an Ethernet network that allows the system control boards 515(1-2) to manage or control one or more domains of the system 10. In one embodiment, the hub 595 allows the I/O board 535 of the system board sets 529(1-18) to communicate with the back-up system control board 515(2) in case the main system control board fails 515(1).

The communications block 594, in one embodiment, may be an application specific integrated circuit (ASIC) that provides a peripheral control interface (PCI) and an Ethernet interface, such as the RIO® ASIC provided by Sun® Microsystems. Accordingly, the communications block 545(1-18), in one embodiment, may perform conversions between PCI/Ethernet signals. For example, the communications block 594 may receive a PCI-formatted signal, convert it to an Ethernet format, and then provide it to the hub 596, which may then transmit the signal to the active system control board 15(1-2) over an Ethernet connection, such as the connection 546(9) or 548(9).

The various system layers, routines, or modules may be executable control units (such as control unit 310(1-2) and 542 (see FIGS. 3 and 5, respectively). Each control unit may include a microprocessor, a microcontroller, a digital signal processor, a processor card (including one or more microprocessors or controllers), or other control or computing devices.

The storage devices referred to in this discussion may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

Figures 6, 7:
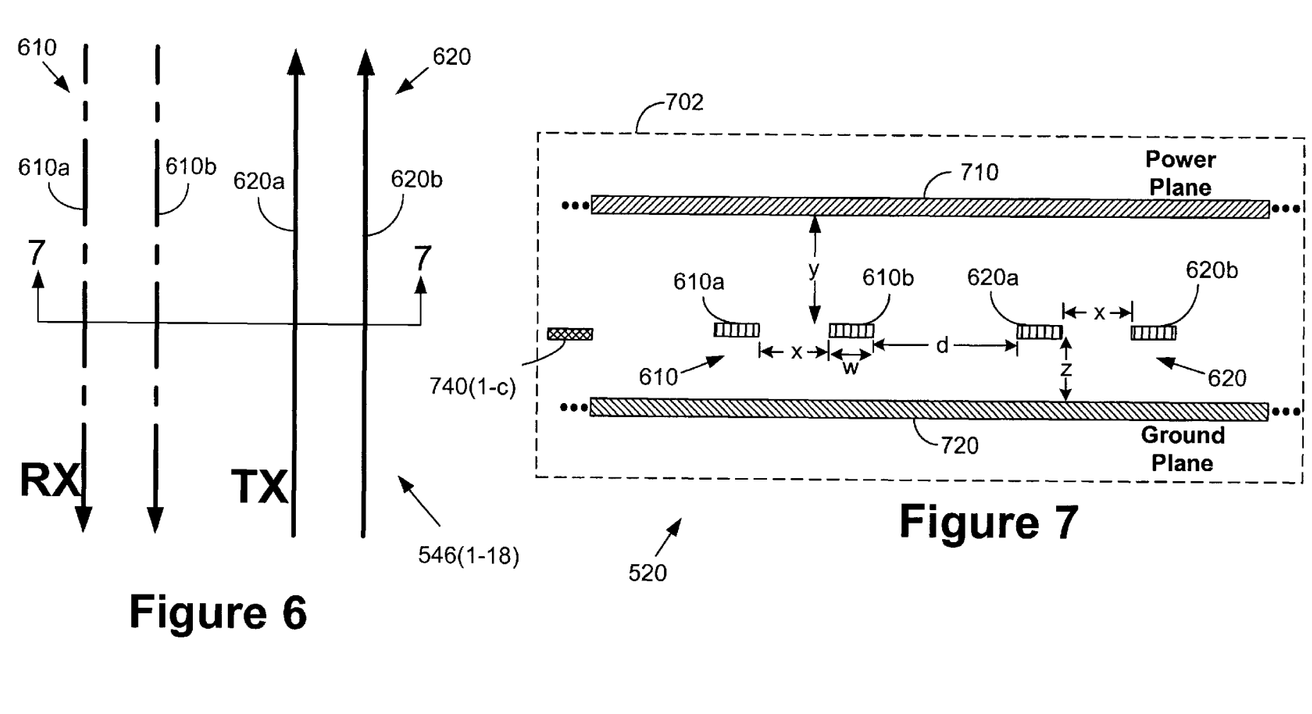
FIG. 6 illustrates one embodiment of one or more connections that may be employed in the system of FIG. 5, in accordance with the present invention.
FIG. 7 shows a cross-sectional view of the one or more connections of FIG. 6, in accordance with one embodiment of the present invention.

Referring now to FIG. 6, one embodiment of a portion of the connections 546(1-18) (see FIG. 5) within the switch 520 is illustrated in accordance with the present invention. For ease of illustration, the discussion herein focuses on the connections 546(1-18) that run from the system control board 515(1) to the respective I/O 535 of each system board sets 529(1-18). It should, however, be appreciated that the discussion herein may also be applicable to the connections 548(1-18), which connect the system control board 515(2) to the system board sets 529(1-18). In the illustrated embodiment of FIG. 6, each connection 546(1-18) may comprise two traces 610 and 620, one for transmitting signals from the system control board 15(1) to the system board sets 529(1-18) and the other for receiving signals from the system board sets 529(1-18). The traces 610, 620, in one embodiment, may be copper traces.

As shown, in one embodiment, the receiving trace 610 is routed as a differential pair, where the first trace 610*a* and second trace 610*b* carry complementary signals. For example, when the signal on the first trace 610*a* is high, the signal on the second trace 610*b* may be low, or vice-versa. In one embodiment, the current in the each trace 610*a*, 610*b* flows in opposite directions. It may be desirable to keep the traces 610*a*/610*b* and 620*a*/620*b* broadside coupled with respect to each other to achieve the desired cross-coupling to reduce noise. As shown in FIG. 6, the transmitting trace 620, in one embodiment, may also be routed as a differential pair, where the first and second traces 620*a* and 620*b* carry complementary signals.

Referring now to FIG. 7, a cross-sectional view taken along the line 7—7 of the connections 546(1-18) shown in FIG. 6 is illustrated, in accordance with one embodiment of the present invention. The illustrated embodiment of FIG. 7 shows a cross-sectional view of a selected portion 702 of the switch 520 that may include one or more of the connections 546(1-18). The power and ground planes 710 and 720, in one embodiment, may each be formed of any desirable conductive material. In one embodiment, the power plane 710 may be adapted to carry a signal of a first preselected voltage level, and the ground plane 720 may be adapted to carry a signal of a second preselected voltage level.

As shown in FIG. 7, in accordance with one embodiment, the traces 610, 620 ran between a power plane 710 and a ground plane 720. As shown, the traces 610, 620 are a first preselected distance (represented by letter "y") from the power plane 710, and a second preselected distance (represented by letter "z") from the ground plane 720. Although not so limited, in the illustrated embodiment, an asymmetrical single stripline topology is employed, which generally means that the y and z distances are not equal (i.e., the traces 610, 620 are off center). In one embodiment, the traces 610, 620 are offset by about 4.5 milli-inches (mils) from the power plane 710, and about 2.9 mils from the ground plane 720.

The traces 610*a*, 610*b* and 620*a*, 620*b* of each respective trace 610,620, in one embodiment, run in parallel, where each pair 610 and 620 is separated from each other by a preselected distance (designated by letter "d"). The distance d, for example, should be such that an adequate amount of isolation is achieved between the two pairs 610 and 620. In one embodiment, the distance d may be about 21 mils. Furthermore, in one embodiment, each pair of traces (e.g., 610*a*/610*b* and 620*a*/620*b*) is separated by a preselected distance (as indicated by letter "x"), where the distance x may be about 5 mils, for example. Additionally, each trace 610*a*, 610*b*, 620*a*, 620*b* may have a width of a preselected distance (designated by letter "w"). Although not so limited, in the illustrated embodiment, each trace 610*a*, 610*b* and 620*a*, 620*b* has a width of about 3 mils.

In one embodiment, the switch 520 may include one or more clocks paths 740(1-c) for routing clock signals to one or more domains defined in the system 500 (see FIG. 5). In one embodiment, the traces 610 and 620 are routed on the same x-y plane on which the one or more clock paths 740(1-c) are routed, and, as such, it may be possible to employ similar isolation techniques for isolating the traces 610, 620 as those employed to isolate the clock signals.

The distances represented by letters d, w, x, y, and z may vary, depending on the particular implementation. In one embodiment, the arrangement and positioning of the traces 610, 620 may be based, in part, for achieving certain, desired coupling effects. For instance, in the illustrated embodiment of FIG. 7, based on their close proximity, the trace pairs 610*a*/610*b* and 620*a*/620*b* are more likely to couple with the ground plane 720. Next, the trace pairs 610*a*/610*b* and 620*a*/620*b* are likely to couple to the power plane 710. Additionally, the traces 610*a*, 610*b* are likely to couple to each other, and the traces 620*a*, 620*b* are likely to couple to each other. Since each of the trace pair 610*a*/610*b* and 620*a*/620*b* is differential in nature, each trace will generally tend to reduce the line flux from its respective counterpart trace. An asymmetrical single stripline topology reduces or eliminates vertical signal to signal coupling and positions the ground plane closer to the signal or signal pair for proper ground plane referencing.

In determining the amount of space needed between neighboring traces (e.g., traces 610, 620 and the distance d between them) to obtain isolation or adequate reduction in interference, it may be desirable to keep a distance of at least three to four times the largest coupling distance. Thus, if the largest coupling distance is 5 mils (e.g., between the pairs 610*a* and 610*b*, for example), then the isolation between the trace 610 and its neighbor should be at least between the range of 15–20 mils (e.g., 3–4×5 mils). In one embodiment, the spacing of the routing grids on the circuit boards may aid in properly spacing the traces 610, 620 to accomplish the desired coupling and isolation objectives.

Figure 8:
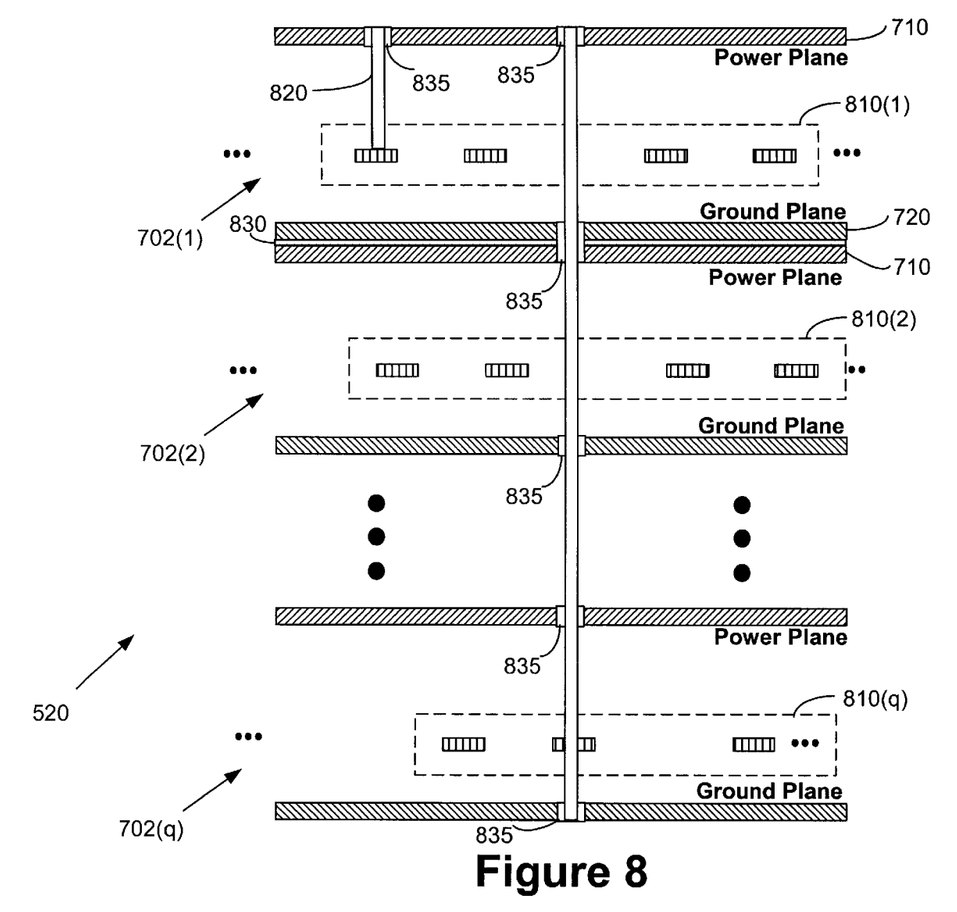
FIG. 8 depicts a cross-sectional view of an alternative embodiment of an arrangement of the one or more connections of FIG. 6, in accordance with the present invention.

Referring now to FIG. 8, a cross-sectional view of an alternative embodiment of an arrangement of the connections 546(1-18) in the switch 520 is illustrated. In particular, FIG. 8 illustrates a plurality of sections 702 (1-q) that may be stacked upon each other within the switch 520, where each section 702(1-q) may then have a set of traces 810(1-q) disposed therein. In one embodiment, this multi-layered arrangement may be implemented in the switch 520 to accommodate a data path, an address path, and a control signal path to manage one or more of the domains in the system 500 (see FIG. 5). The sections 702(1-q), in one embodiment, may be offset from each other.

As shown, in one embodiment, each set of traces 810(1-q) in the plurality of sections 702(1-q) is disposed intermediate the power plane 710 and ground plane 720, which act to generally shield the set of traces 810(1-q) of different layers from each other. In one embodiment, each set of power plane 710 and ground plane 720 of each section 702(1-q) is separated from its neighboring set by an isolation layer 830. In an alternative embodiment, the isolation layer 830 may not be required if each set of traces 810(1-q) is run between a series of alternating power planes 710 and ground planes 720 (i.e., as opposed to between a set of power plane 710 and ground plane 720 of each section 702(1-q)).

In one embodiment, the exemplary arrangement of FIG. 8 includes one or more vias 820 to interconnect one or more traces within the plurality of sections 702(1-q). A dielectric material 835, in one embodiment, may isolate the vias 820 from the power planes 710 and the ground planes 720.

In one embodiment, each one of the traces 610, 620 may be routed in segments. For example, as can be seen with reference to FIG. 5, in one embodiment, the trace 610, 620 running from the system control board 515(1) to the I/O board 535 of the system board set 529(9) (i.e., the traces 610, 620 corresponding to the connection 546(9)) may be formed of several segments. That is, for example, one segment may ran from a port (not shown) of the I/O board 535 to a port (not shown) of the expansion board 540 of the system board set 529(9), a second segment may run from the expansion board 540 to the switch 520, a third segment may be within the switch 520, and a fourth segment may ran from the switch 520 to the system control board 515(1). In some instances, one or more segments may be "grouped" together based on their physical proximity on the board. Thus, for example, the segment of traces 610, 620 running from the communications blocks 545(1-18) of the system control board 515(1) to the switch 520 may belong to a common group.

In one embodiment, it may be desirable to have all segments belonging to a selected group to be of substantially the same length. For example, even though each of the communications blocks 545(1-18) may be of a different distance from the switch 520, it may nevertheless be desirable, in one embodiment, to have each segment connecting each communications blocks 545(1-18) to the switch 520 to be of substantially the same length to reduce signal skew, for instance. In one embodiment, it may be possible that some of the segments extending from the communications blocks 545(1-18) may pass through a common port (not shown) of the system control board 515(1) to reach the switch 520. In such an instance, it may be desirable, in one embodiment, that the length of such segments is substantially the same from the communications blocks 545(1-18) to the port, regardless of the physical proximity of individual communications blocks 545(1-18). One way of substantially equalizing segment lengths is to employ a padding scheme, such as the one shown in FIG. 9.

Figure 9:
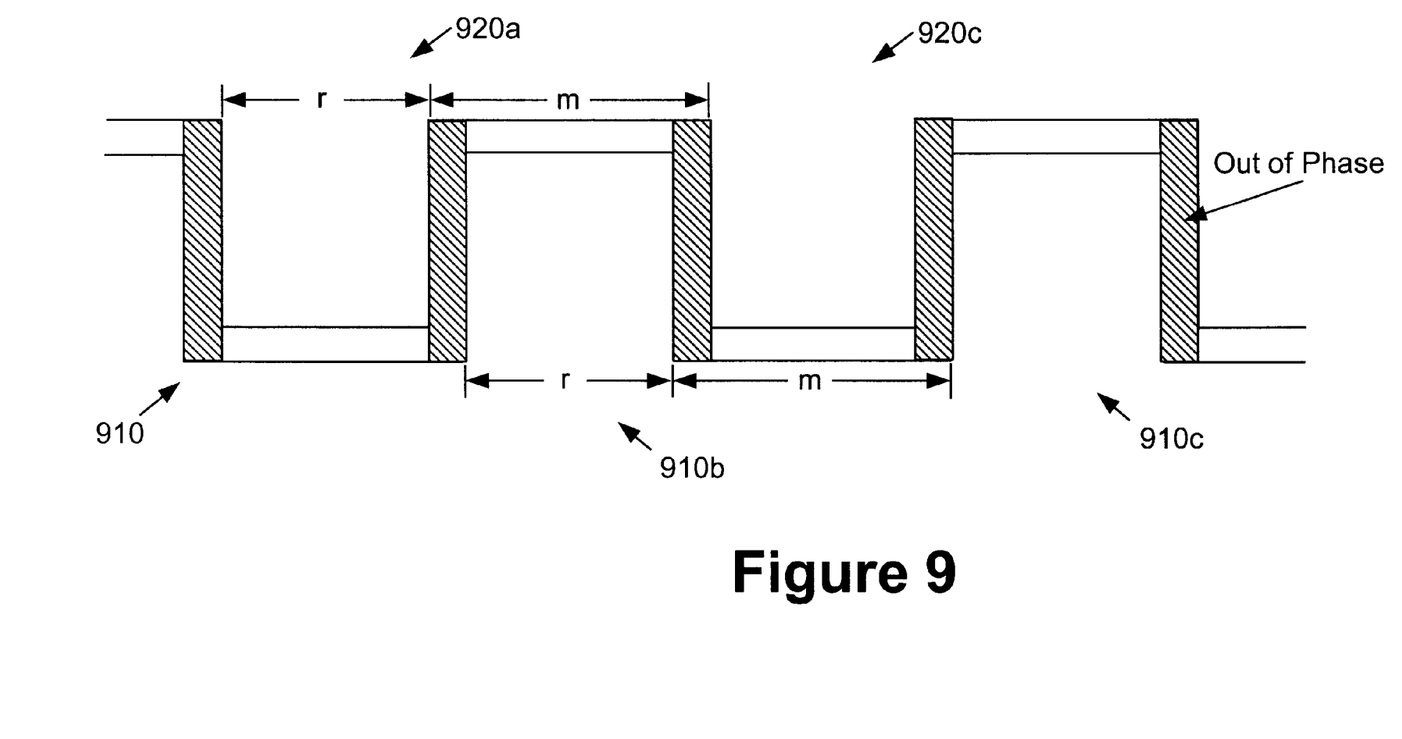
FIG. 9 illustrates an exemplary padding scheme that may be employed in the connections of FIG. 6, in accordance with one embodiment of the present invention.

FIG. 9 illustrates an exemplary padding scheme that may be employed in the differential traces 610, 620 of FIG. 6, in accordance with one embodiment of the present invention. Padding may be employed to reduce undesirable conditions, such as signal skew and signal attenuation. Generally, when padding differential traces 610, 620 to meet a draw-to-length, a time-stamp, or a minimum path requirement, it may be desirable to maintain at least some selected amount of spacing between a first portion (e.g., 920a) of a differential pair and another like portion (e.g., 920b) of that pair. As shown in FIG. 9, a distance of "r" is maintained between the first portion (e.g., 920a) of the differential pair and the next like (e.g., 920b) portion. In one embodiment, the distance r may be 30 mils. The width of each padded portion (represented by the letter "m"), in one embodiment, may be 46 mils. Generally, the length of the padded segment may of be any desirable length with some acceptable amount of uniformity from segment to segment.

Figure 10:
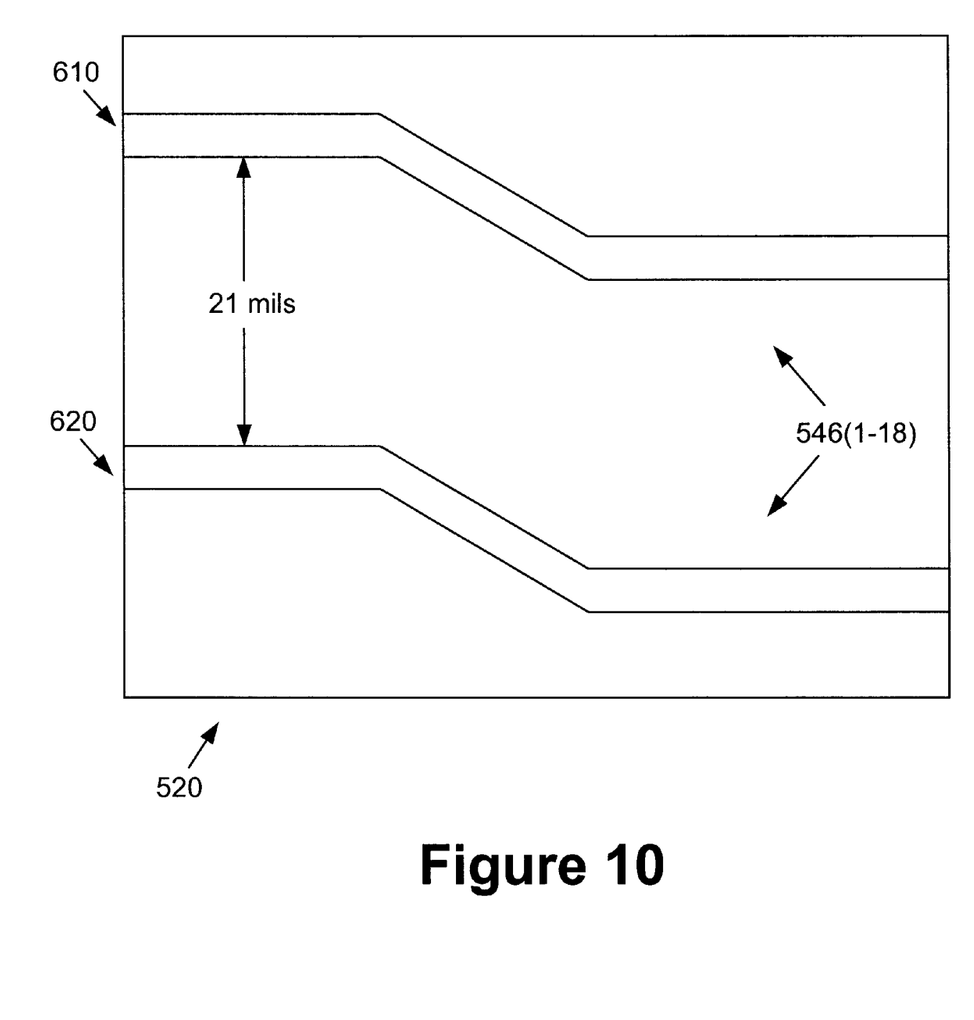
FIG. 10 depicts an exemplary path that may be taken by the one or more connections of FIG. 6 in the system of FIG. 5, in accordance with one embodiment of the present invention.

Referring now to FIG. 10, an exemplary path of the receiving and transmitting traces 610, 620 in the switch 520 is illustrated, in accordance with one embodiment of the present invention. As can be seen in the illustrated embodiment, the traces 610, 620 are isolated by at least a distance of about 21 mils. In other embodiments, other isolation distances that reduce the coupling effect due to neighboring traces 610, 620 may be also used. The physical layout of the traces 610, 620 may take any desirable form and may be implementation specific.

In one embodiment, it is desirable to have the same physical characteristics for each receiving and transmitting trace 610, 620 to reduce noise or other unwanted signals. For example, it may be desirable to have all of the receiving traces 610 to be of the same length, to have the same via counts, and the like. Similarly, in one embodiment, it may be desirable to have all of the transmitting traces 620 to have the same physical characteristics.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processor-based system, comprising:
    at least a first domain;
    a circuit board including one or more traces disposed asymmetrically between a power plane and a ground plane;
    a first control unit; and
    a second control unit;
    wherein the first and second control units manage the first domain over the one or more traces using a network communication protocol during substantially non-overlapping intervals.

2. The processor-based system of claim 1, wherein the one or more traces are disposed closer to the ground plane than the power plane.

3. The processor-based system of claim 1, wherein the one or more traces comprise two pairs of traces, one pair for transmitting differential signals to the first domain and the other pair for receiving differential signals from the first domain.

4. The processor-based system of claim 1, wherein the communication protocol is compatible with the Ethernet protocol.

5. A circuit board, comprising:
- a first conductive plane configured to convey a first voltage level;
- a second conductive plane configured to convey a second voltage level; and
- a signal path asymmetrically positioned between the first conductive plane and the second conductive plane, wherein the signal path is configured to convey signals between one or more devices using a network communication protocol.

6. The circuit board of claim 5, wherein the signal path is positioned a first distance from the first conductive plane and a second distance from the second conductive plane, wherein the second distance is smaller than the first distance.

7. The circuit board of claim 6, wherein the signal path includes a transmit path and a receive path.

8. The circuit board of claim 7, wherein the transmit path includes a first pair of traces configured to convey a first differential signal pair and the receive path includes a second pair of traces configured to convey a second differential signal pair.

9. The circuit board of claim 8, wherein the first pair of traces and the second pair of traces are separated by a third distance.

10. The circuit board of claim 9, further comprising a second signal path asymmetrically positioned between the first conductive plane and the second conductive plane, wherein the second signal path is positioned the first distance from the first conductive plane and the second distance from the second conductive plane and wherein the second signal path is positioned a fourth distance from the signal path.

11. The circuit board of claim 10, wherein the second signal path includes a third pair of traces configured to convey a third differential signal pair, wherein the third differential signal is a clock signal.

12. The circuit board of claim 10, wherein the fourth distance is greater than the third distance.

13. The circuit board of claim 5, wherein the network communication protocol is compatible with the Ethernet protocol.

14. The circuit board of claim 5, wherein the one or more devices include one or more domains of a system, and wherein the signal path is configured to convey control signals between the one or more domains for managing inter-domain communications between the one or more domains.

15. The circuit board of claim 5, wherein the first conductive plane is a power plane and the second conductive plane is a ground plane.

16. A method of conveying signals on a circuit board of a computer system, the method comprising:
- conveying a first voltage level on a power plane of the circuit board;
- conveying a ground reference on a ground plane of the circuit board; and
- conveying signals between one or more domains of the computer system using a communication protocol using a signal path asymmetrically positioned between the power plane and the ground plane.

17. The method of claim 16, wherein the signal path is positioned a first distance from the first conductive plane and a second distance from the second conductive plane, wherein the second distance is smaller than the first distance.

18. The method of claim 16, wherein the communication protocol is compatible with the Ethernet protocol.

19. The method of claim 16, wherein the signal path includes a transmit path and a receive path, wherein the transmit path includes a first pair of traces configured to convey a first differential signal pair and the receive path includes a second pair of traces configured to convey a second differential signal pair.

20. The method of claim 16, further comprising conveying control signals between the one or more domains for managing inter-domain communications between the one or more domains.

21. A computer system, comprising:
- a system board including one or more system domains;
- a system control board configured to manage the one or more system domains;
- a switch including one or more switch circuit boards coupled between the system board and the system control board, wherein given ones of the one or more switch circuit boards include:
  - a power plane;
  - a ground plane; and
  - a receive path and transmit path disposed between the power plane and the ground plane, wherein the receive path and transmit path are positioned closer to the ground plane relative to the power plane and wherein the receive path and the transmit path are configured to convey control signals between the system control board and the one or more domains using a communication protocol.

22. The computer system of claim 21, wherein the communication protocol is compatible with the Ethernet protocol.

23. The computer system of claim 21, wherein the transmit path includes a first pair of traces configured to convey a first differential signal pair and the receive path includes a second pair of traces configured to convey a second differential signal pair.

24. A computer system comprising:
- a plurality of system boards including a plurality of processing units operating in a plurality of system domains;
- a plurality of system control boards configured to manage the plurality of system domains;
- a switch including a switch circuit board coupled to convey control signals between the plurality of system boards and the plurality of system control boards using an Ethernet communication protocol;
- wherein the switch circuit board includes:
  - a power plane;
  - a ground plane; and
  - a receive path and transmit path disposed between the power plane and the ground plane, wherein the receive path and transmit path are positioned closer to the ground plane relative to the power plane and wherein the receive path and the transmit path are configured to the convey control signals.

* * * * *